United States Patent
Lee et al.

(10) Patent No.: US 7,042,229 B2
(45) Date of Patent: May 9, 2006

(54) SYSTEM AND METHOD FOR ON LINE MONITORING OF INSULATION CONDITION FOR DC MACHINES

(75) Inventors: Sang-Bin Lee, Seoul (KR); Karim Abdelkrim Younsi, Ballston Lake, NY (US); Patrick Lee Jansen, Alplaus, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/905,072

(22) Filed: Dec. 14, 2004

(65) Prior Publication Data

US 2005/0218907 A1    Oct. 6, 2005

Related U.S. Application Data

(63) Continuation-in-part of application No. 10/814,839, filed on Mar. 31, 2004.

(51) Int. Cl.
*H01H 31/12* (2006.01)
*H04B 3/46* (2006.01)
*H02P 3/00* (2006.01)
*H02H 5/04* (2006.01)

(52) U.S. Cl. ............... 324/551; 324/545; 318/478; 361/23

(58) Field of Classification Search ........ 324/551, 324/536, 772, 538–554, 558–559; 310/180–184, 310/40 R–46; 702/57–60; 318/449–455, 318/478–479, 490
See application file for complete search history.

(56) References Cited

U.S. PATENT DOCUMENTS

| | | | | |
|---|---|---|---|---|
| 3,746,979 | A | * | 7/1973 | Klidishev et al. ........... 324/545 |
| 4,996,486 | A | * | 2/1991 | Posedel ...................... 324/545 |
| 5,194,817 | A | * | 3/1993 | Ward .......................... 324/544 |
| 5,270,640 | A | * | 12/1993 | Kohler et al. ............... 324/772 |
| 5,514,967 | A | * | 5/1996 | Zelm .......................... 324/551 |
| 5,612,601 | A | * | 3/1997 | Kueck et al. ............... 318/449 |
| 6,392,422 | B1 | * | 5/2002 | Kammer et al. ............ 324/650 |
| 6,504,382 | B1 | | 1/2003 | Smith et al. ................ 324/551 |
| 6,580,276 | B1 | | 6/2003 | Hilal .......................... 324/547 |
| 6,798,210 | B1 | * | 9/2004 | Goodrich et al. .......... 324/510 |
| 6,806,719 | B1 | * | 10/2004 | Awaji ......................... 324/541 |
| 2002/0079906 | A1 | | 6/2002 | Rashkes et al. ............ 324/544 |
| 2003/0160602 | A1 | | 8/2003 | Anand et al. ............... 324/126 |

OTHER PUBLICATIONS

U.S. Appl. No. 10/814,839, filed Dec. 14, 2004, Abdelkrim Younsi.

* cited by examiner

*Primary Examiner*—Anjan Deb
*Assistant Examiner*—Jeff Natalini
(74) *Attorney, Agent, or Firm*—Cantor Colburn LLP

(57) ABSTRACT

Insulation condition monitoring systems and methods for a rotating DC electric machine, the method comprising: measuring a first set of values for an instantaneous differential current and an instantaneous voltage during operation of the rotating DC electric machine; calculating a value for a phasor current and phasor voltage based upon the first set of values of the instantaneous differential current and the instantaneous voltage, respectively; calculating an angular relationship between the phasor current and the phasor voltage; and determining insulation condition based on the angular relationship.

27 Claims, 4 Drawing Sheets

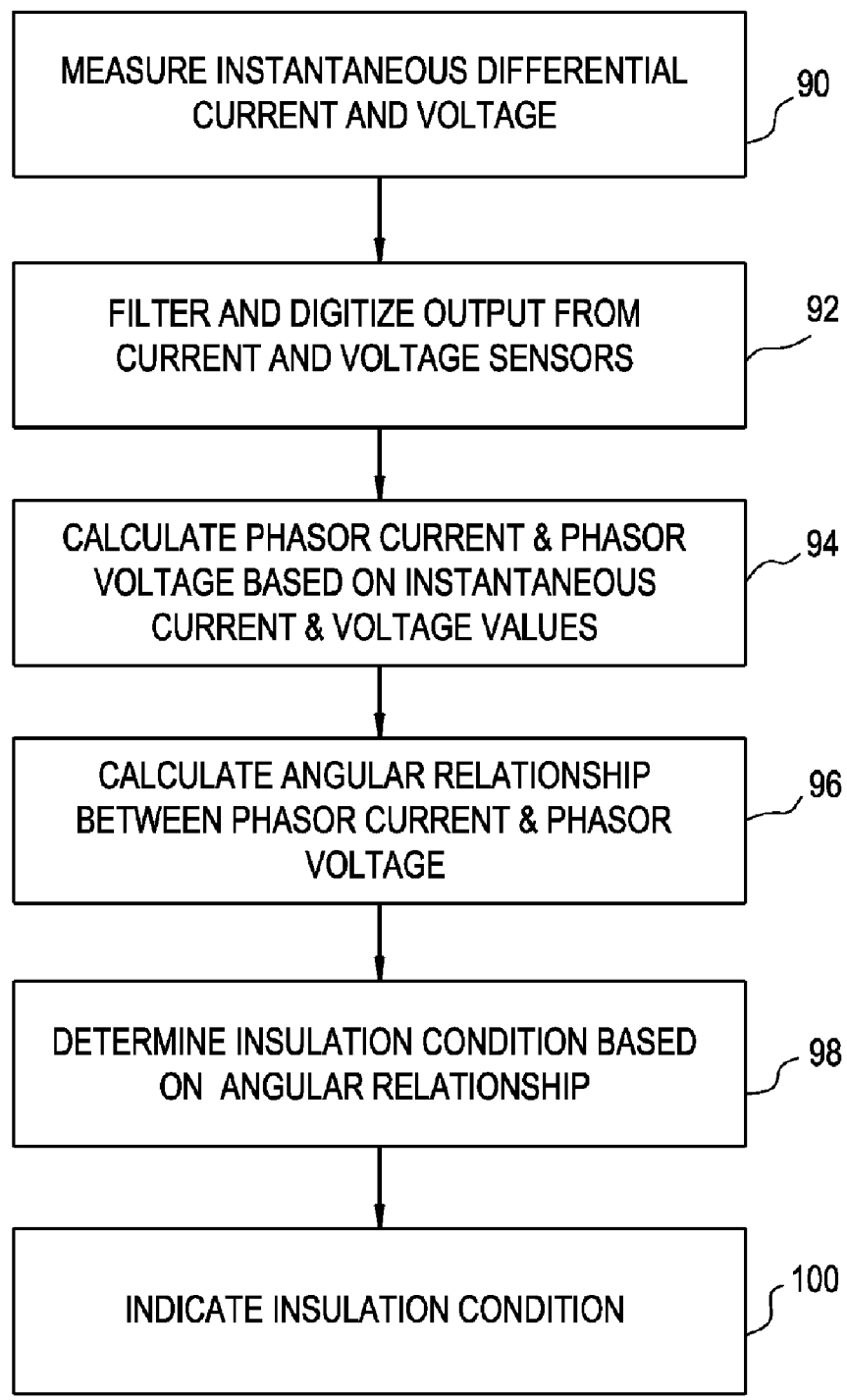

SYSTEM AND METHOD FOR ON LINE MONITORING OF INSULATION CONDITION FOR DC MACHINES

CROSS REFERENCE TO RELATED APPLICATIONS

This application is a continuation-in-part application of U.S. Ser. No. 10/814,839, filed Mar. 31, 2004 the contents of which are incorporated by reference herein in their entirety.

BACKGROUND OF THE INVENTION

The present invention relates to insulation condition monitoring, and more specifically to a technique for monitoring of the state of insulation, such as for stator winding insulation condition monitoring.

Many different types of electrical machines employ windings and other conductors that are insulated by various insulation systems. For example, motors and generators commonly include wound rotors and stators, or may include preformed windings or coils. The conductors typically serve either simply to conduct electrical current, or to produce magnetic fields by virtue of the flow of such current. Insulation systems separate conductors and windings from one another, and from adjacent components in the assembled system. Such insulation systems may include various varnish systems, tapes, coatings, sleeves, and so forth, or combinations of these. The integrity of the insulation systems is important to the reliability and life expectancy of the electrical equipments in which they are installed.

Insulating systems may break down for many reasons, jeopardizing the continued operation of electrical equipment. The winding insulation, for example, for electric machines is subject to damage and deterioration caused by thermal, electrical, mechanical, chemical and environmental stresses. Typical insulation failure occurs in the slot section between turns or between the coil and ground, and at end windings between coils of adjacent phases. Winding insulation degradation can result in acceleration of machine failure, which decreases the service life of the machine and results in increased costs due to repair or replacement cost and loss of revenue due to machine outage. Therefore it is desirable to monitor the insulation condition for scheduling repair or replacement of winding insulation to prevent such a failure, or at least to anticipate when maintenance or service may become in order.

Off line methods for evaluating the insulation condition include over-voltage hi-pot or high voltage ramp tests, insulation resistance or polarization index tests, surge tests, dissipation factor tests, also known as "tan delta" or power factor tests, and off-line partial discharge tests. Such tests have been extensively used and accepted over many years in providing the condition of the winding insulation. However, these conventional off-line techniques can be intrusive and costly since it is required that the electrical machine be shut down and taken out of service to perform the required diagnostic test and/or measurement. The regular machine maintenance is typically performed once every 3–6 years; therefore, the off-line stator insulation condition cannot be evaluated frequently enough to guarantee reliable operation of the machine until the next outage.

Several on-line measurement techniques are also available for monitoring the winding insulation condition. These include vibration measurement and monitoring, temperature measurement, and differential current measurement. One major drawback of these methods is that the monitoring system detects severe fault conditions only after the fault has occurred, making proactive maintenance and servicing difficult. The on-line partial discharge detects early symptoms of insulation degradation; however, it requires expensive specialized equipment and accurate interpretation of the measurements relies on the skill of an operator.

Accordingly, there is a need for a low cost, simple, and reliable on-line solution for assessing the insulation condition for a DC machine.

BRIEF DESCRIPTION OF THE INVENTION

Briefly, in accordance with one aspect of an exemplary embodiment, disclosed herein is an insulation condition monitoring method, the method comprising: measuring a first set of values for an instantaneous differential current and an instantaneous voltage during operation of a DC rotating machine; calculating a value for a phasor current and phasor voltage based upon the first set of values of the instantaneous differential current and the instantaneous voltage, respectively; calculating an angular relationship between the phasor current and the phasor voltage; and determining insulation condition based on the angular relationship.

Also disclosed herein in another exemplary embodiment is a method of operating an insulation condition monitoring system, the method comprising: measuring a first set of values for an instantaneous differential current and an instantaneous voltage during operation of a rotating DC electric machine; calculating a value for a phasor current and a phasor voltage based upon the first set of values of the instantaneous differential current and the instantaneous phase voltage, respectively; calculating an angular relationship between the phasor current and the phasor voltage; calculating at least one desired parameter based on the angular relationship between the phasor current and the phasor voltage for determining insulation condition.

Further disclosed herein in an exemplary embodiment is an insulation condition monitoring system, the system comprising: a differential current sensor coupled to a rotating DC electric machine for measuring values of current; a voltage sensor coupled to the rotating electric machine for measuring values of AC voltage; and a processing module coupled to the current sensor and the voltage sensor, the processing module configured to convert values for instantaneous differential current and instantaneous voltage to respective values for phasor current and phasor voltage, and wherein the processing module is further configured to calculate an angular relationship between the phasor current and the phasor voltage and generating an output based on the angular relationship as an indication of insulation condition.

In yet another exemplary embodiment there is disclosed a rotating electric machine, comprising: an armature and a field winding configured to conduct electric current and generate magnetic field by virtue of flow of the current; a plurality of conductors to conduct electric current to the windings; an insulation system for insulating the windings; an insulation condition monitoring system including: a differential current sensor coupled to the rotating electric machine for measuring values of instantaneous differential current of at least one of the armature and the field winding; a voltage sensor coupled to the rotating electric machine for measuring values of instantaneous voltage of the at least one of the armature and the field winding; and a processing module coupled to the current sensor and the voltage sensor, the processing module configured to convert values for instantaneous differential current and instantaneous voltage to respective values for phasor current and phasor voltage, and wherein the processing module is further configured to calculate an angular relationship between the phasor current and the phasor voltage and generating an output based on the angular relationship as an indication of insulation condition.

In another embodiment, there is disclosed an insulation condition monitoring system for a rotating DC electric machine, the system comprising: a means for measuring a first set of values for an instantaneous differential current and an instantaneous differential voltage during operation of the rotating DC electric machine; a means for calculating a value for a phasor current and a value for a phasor voltage based upon the first set of values of the instantaneous differential current and the instantaneous phase voltage, respectively; a means for calculating an angular relationship between the phasor current and the phasor voltage; and a means for determining insulation condition based on the angular relationship.

Also disclosed herein in another exemplary embodiment is a storage medium encoded with a machine-readable computer program code including instructions for causing a computer to implement the abovementioned methods monitoring an insulation condition of a rotating DC electric machine.

In addition, in yet another exemplary embodiment there is disclosed a computer data signal embodied in a computer readable format the computer data signal including instructions for causing a computer to implement the abovementioned methods for monitoring an insulation condition of a rotating DC electric machine.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein:

FIG. 5 is a flow chart illustrating exemplary steps involved in the insulation condition monitoring via a system of the type shown in FIG. 1.

DETAILED DESCRIPTION OF THE INVENTION

Disclosed herein are numerous exemplary embodiments of insulation condition monitoring systems and methodologies for a DC rotating electric machine, while in operation. A first set of values for an instantaneous differential current and an instantaneous voltage are measured during operation of the machine. A value for a phasor current and phasor voltage are calculated based upon the first set of values of the instantaneous differential current and the instantaneous voltage, respectively. From the phasor voltage and phasor current an angular relationship is determined, yielding an indication of an insulation condition based on the angular relationship.

An insulation condition monitoring system for an AC rotating machine is disclosed in U.S. patent application Ser. No. 10/814,839. The system includes a differential current sensor and a voltage sensor coupled to each phase of the machine for measuring the instantaneous differential current and the instantaneous phase voltage, respectively. A processing module is configured for converting the values of the instantaneous differential current and the instantaneous phase voltage to respective phasor quantities, i.e. magnitudes and phase angles. The processing module further calculates an angular relationship between phasor current and phasor voltage and generates an output based on the calculated angular relationship, as an indication of insulation condition.

Figure 1:
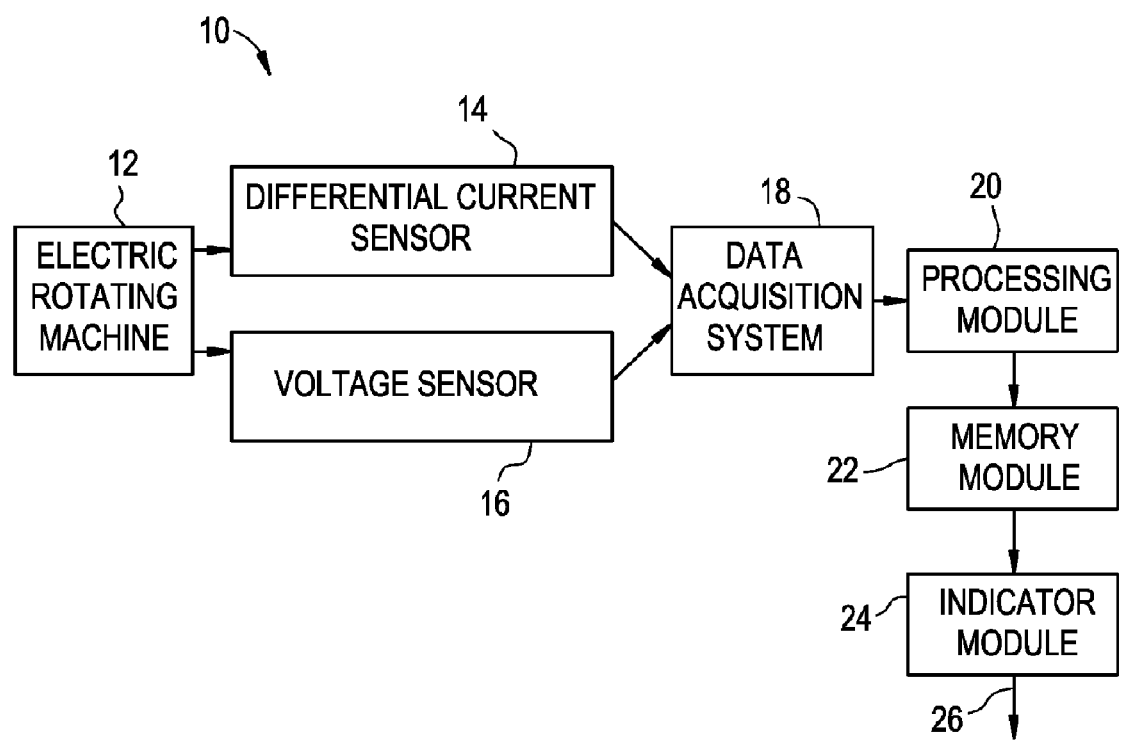
FIG. 1 is a diagrammatical view of an exemplary insulation condition monitoring system for an electric rotating machine in accordance with aspects of the present techniques.

Referring now to FIG. 1, an online insulation condition monitoring system 10 is illustrated for a rotating electric machine 12, which is typically a motor or a generator. The system 10 includes, but is not limited to, a differential current sensor 14 and a voltage sensor 16 coupled to the machine 12, for measuring values for the instantaneous differential current and the instantaneous phase voltage respectively. A data acquisition system 18 enables measurement of signals from the output of the differential current sensor 14 and the voltage sensor 16.

The signals from the sensors 14 and 16, measured by the data acquisition system 18, are applied to a processing module 20. In order to perform the prescribed functions and desired processing, as well as the computations therefore, module 20 may include, but not be limited to, hardware circuitry and software for performing computations indicative of insulation condition as described below. Module 20 may thus include a range of circuitry types, such as, computer(s), a microprocessor based module, processor(s), application-specific or general purpose computer, programmable logic controller, or even a logical module or code within such a device, gate array(s), custom logic, memory, storage, register(s), timing, interrupt(s), communication interfaces, and input/output signal interfaces, as well as combinations comprising at least one of the foregoing. Module 20 may also include inputs and input signal filtering and the like, to enable accurate sampling and conversion or acquisitions of signals from communications interfaces and inputs. Additional features of module 20 and certain processes therein are thoroughly discussed at a later point herein.

One or more embodiments of the invention may be implemented as new or updated firmware and software executed in module 20 and/or other processing controllers. Software functions include, but are not limited to firmware and may be implemented in hardware, software, or a combination thereof. Thus a distinct advantage of the described embodiments is that they may be implemented for use with existing and/or new processing systems.

The module 20 is configured to convert the values for the instantaneous differential current and the instantaneous motor voltages to respective values for phasor currents and phasor voltages associated with selected frequencies of the excitation voltage. The processing module 20 further calculates an angular relationship between selected phasor currents and phasor voltages and generates an output based on the calculated angular relationship, as an indication of insulation condition. A memory module 21 is used for storing the output generated from the processing module 20. The same, or a different memory module may also store programming code, as well as parameters and values required for the calculations made by the processing module 20. An indicator module 24 compares the output of the processing module 20 to a predetermined threshold value and generates an indication signal 26 based on the comparison. In general, the indication signal 26 may provide a simple status output, or may be used to activate or set a flag, such as an alert when the output of the processing module 20 exceeds the threshold value, indicating that the insulation is in need of attention or will be in need of attention based upon its current state or a trend in its state.

Figure 2:
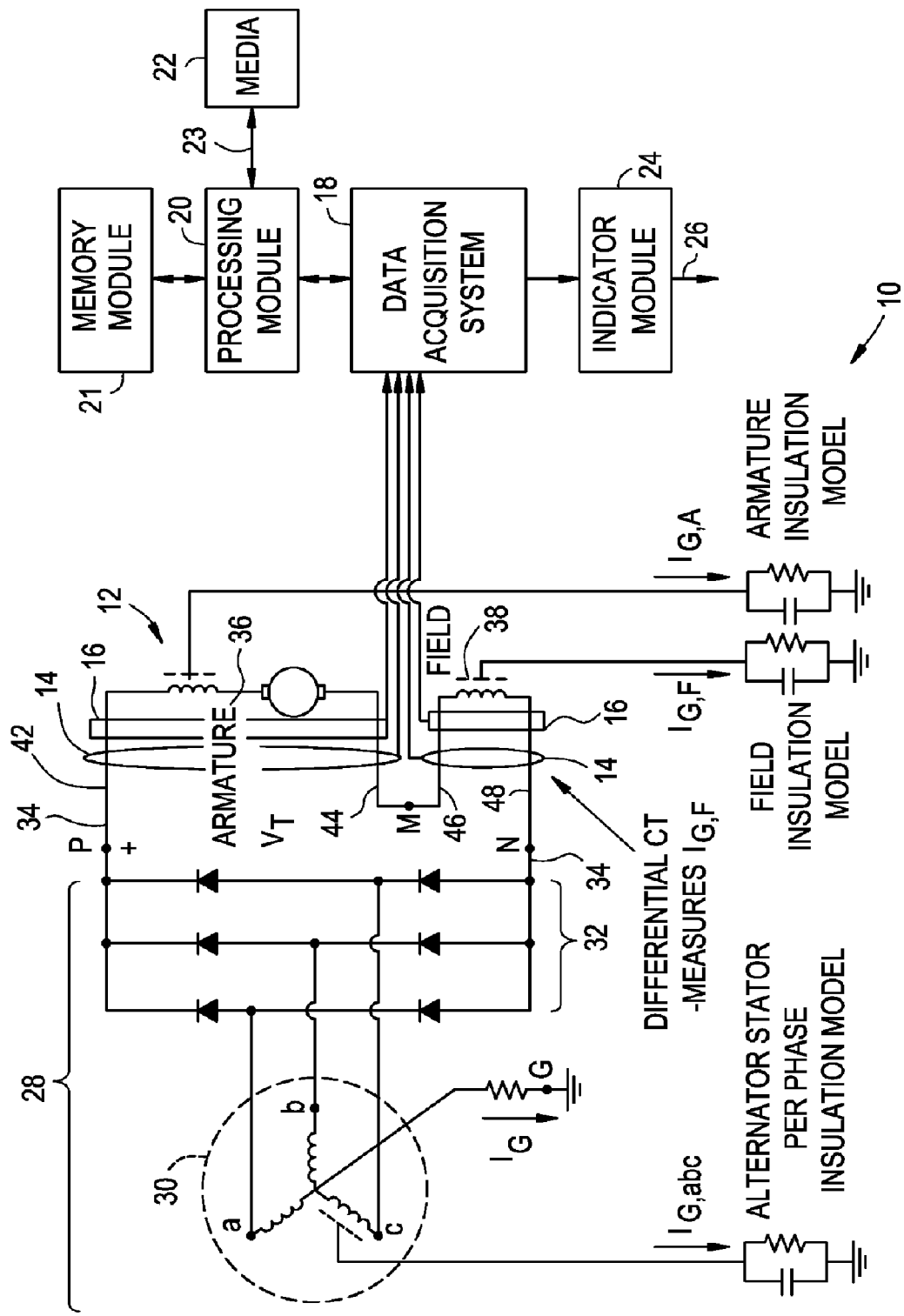
FIG. 2 is a diagrammatical view of a series connected DC electric rotating machine instrumented for monitoring of insulation condition via a system of the type shown in FIG. 1.

FIG. 2 depicts an exemplary embodiment of an online insulation condition monitoring system 10 for a DC electric rotating machine 12. In the illustrated embodiment a series connected DC machine is depicted, however the principles of the exemplary embodiments disclosed herein are readily applicable to any configuration of DC electric machine 12, including, but not limited to separately excited, series, shunt, compound, differential, and the like. In the illustrated embodiment, a power source 28 is shown for providing power to the DC electric machine 12. In a typical application, the power source 28 may include a power grid, rectified and directly coupled to the machine, or may include a drive, such as an alternator coupled to an inverter drive, converter, rectifier and so forth. As shown, for the purpose of illustration, the power source 28 is depicted as a three-phase alternator 30 coupled to three-phase full wave bridge rectifier 32.

Advantageously, it is this excitation that facilitates the exemplary embodiments disclosed herein. In particular, the full wave rectified DC voltage as applied to the motor 12 includes a DC component and AC ripple voltage resultant from the rectification. The ripple voltage is exploited to facilitate the evaluation of the characteristics of the electric machine 12. It will be appreciated that for an three-phase alternator driven full wave rectified voltage, the frequency of the alternator being given by:

$$f_e = N_m P / 120 \quad (1)$$

where $f_e$ is the electrical frequency;

$N_m$ is the rotational speed of the alternator; and

P is the number of pole pairs in the alternator.

The ripple voltage will exhibit AC components with frequencies given by:

$$6f_e * n, n=1,2,3,\ldots \quad (2)$$

It will be appreciated that by measuring the instantaneous AC voltage and current across the windings, the effect of the AC voltage on the windings of the electric machine 12 may then be deduced. The differential current sensor 14 and voltage sensor 16 preferably exhibit a bandwidth sufficient to ensure accurate measurement of all or most frequencies that exhibit a significant impact on the insulation condition. These frequencies are associated with the phasor quantities of interest for evaluating the insulation condition. For example, the fundamental, third, fifth, and seventh harmonics of the ripple voltage may be measured and employed. Furthermore, it will be appreciated that the instantaneous AC voltage and instantaneous current signals are preferably digitized at a sampling frequency sufficient for obtaining the desired phasor quantities.

Continuing now with FIG. 2, the power source 28 provides power to the DC electric machine via a DC bus 34 depicted in the figure with P indicating positive voltage and N indicating negative or alternatively ground. Power from the DC bus 34 is coupled to a series connected armature winding 36 and then field winding 38 of the DC electric machine 12. Thus, it will be appreciated that for a series connected electric machine 12, the armature winding 36 and field winding 38 share essentially the same series current (minus leakage) and divide the DC bus voltage. It will be further appreciated that for a different configuration of the DC electric machine 12 the arrangement of the armature winding and field winding will also result in application of different voltages and currents. For example, for a shunt connected (parallel) DC electric machine, the armature winding and field winding share the same voltage yet divide the applied current.

As depicted in the figure, current flows from the DC bus 34 through conductor 42 to the armature winding 34 exiting on conductor 44 and enters the field winding 36 from conductor 46 exiting on conductor 48

An exemplary embodiment provides for determining the condition of insulation systems of each of the windings or winding groups 36, and 38 as well as of the entire machine 12. As will be appreciated by those skilled in the art, such insulation systems may include varnishes, tapes, sleeves, or combinations of such materials. The breakdown in such systems may result in partial or total failure in one or more conductors, windings, or groups of windings. Moreover, it should be noted that various types of machines may benefit from the present techniques, including motors and generators. Such machines may be wound in a variety of patterns, and interconnected in various manners, such as series, or shunt, in various numbers of poles and in various numbers of winding groups. Similarly, insulation conditions may be detected and monitored both after degradation has occurred, as well as before significant degradation has occurred, such as by trending. Finally, as discussed below, the present techniques may be used to identify and even to localize insulation conditions in individual windings, groups of windings and in the entire machine.

In the embodiment illustrated in FIG. 2, the armature winding 36, and field winding 38 are provided with power via sets of power conductors or leads 42 and 44, respectively. Also in an illustrated embodiment, the armature winding 36 and field winding 44 are coupled in series across the DC power bus 34. As illustrated, a plurality of differential current sensors 14, and voltage sensors 16 are provided for each the armature and field windings 36, 38 respectively, and associated with the power conductors 42/44 and 46/48 respectively, for detecting the differential current through and voltage across the conductors. The current sensors are differential current sensors configured to generate feedback signals representative of instantaneous differential current through each winding e.g., 36 and 38. Similarly, the voltage sensors are adapted to measure the voltage across the windings. Output from the sensors is provided to the data acquisition system 18, and therethrough, to the processing module 20. As discussed below, based upon these sensed parameters, processing module 20 evaluates the condition of insulation of the windings. It will be appreciated that while an exemplary embodiment is described as employing differential current and voltage sensors to capture the current through and voltage across each winding, other configurations are possible and readily within the scope of the claims. For example, a single voltage sensor could be employed on the DC power bus 34 and the voltage divided accordingly, or a sensor on the DC power bus 34 and one between windings facilitate determination of the voltages across the windings of the machine. Furthermore, it should also be appreciated that the sensors are preferably, but not necessarily configured to measure AC parameters only. Other configurations are possible such as differential sensors or multiple unipolar sensors may be employed coupled with the appropriate processing to perform equivalent functionality.

Figure 3:
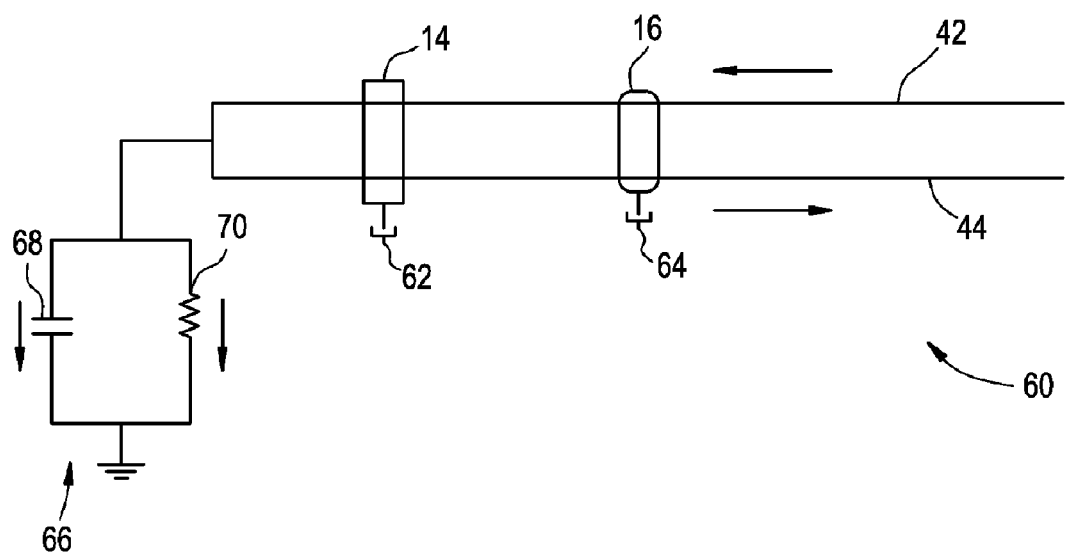
FIG. 3 is a diagrammatical representation of an equivalent, analogous circuit in a system for measuring a phase angle relationship between differential current and voltage for a rotating machine of the type illustrated in FIG. 2.

FIG. 3 is a diagrammatical illustration 60 of an equivalent circuit for a winding insulation system in one of the armature winding 36 of the system 10 shown in FIG. 2. As illustrated, the current sensor 14 provides an instantaneous differential current signal, as indicated by reference numeral 62. Similarly, voltage sensor 16 generates a signal representative of the voltage across the armature winding 36, as indicated by reference numeral 64. An equivalent circuit 66 for the winding or winding group insulation includes a capacitance 68 and a resistance 70 coupled electrically in parallel as shown. A similar illustration would be equally applicable for the field winding 38.

In accordance with an exemplary embodiment, and with the diagram of FIG. 3, a total current between the incoming conductor 42 and conductor 44 input to the winding 36, 38, as indicated by the arrow adjacent to conductor 42 includes the sum of the load current drawn by the winding, and the current applied to the insulation system, including the current through the capacitance 68 and the resistance 70. The current exiting the winding, as indicated by the arrow adjacent to common conductor 44 includes the current applied to the insulation system only, including that of the capacitance 68 and the resistance 70.

Figure 4:
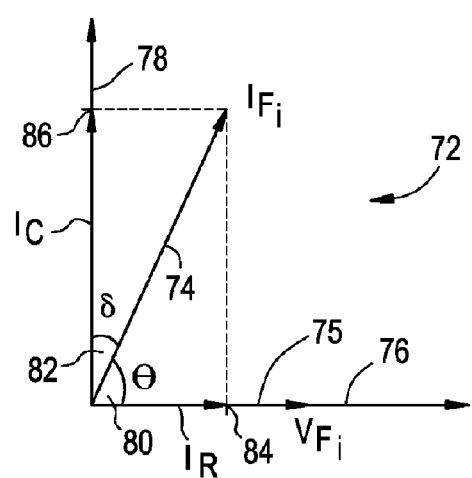
FIG. 4 is a phasor diagram illustrating a relationship between phasor voltage and differential current for insulation condition monitoring in accordance with aspects of the present technique.

Based upon the sensed instantaneous differential currents and voltages, then, these currents may be computed and spectrally separated, with phasor angular relationships between them used to provide an indication of the state of the winding insulation system. In an exemplary embodiment, the phasor quantities may be separated employing commonly known Fourier techniques for determining the frequency content of a signal. The phasor quantities then representing the voltage and currents at selected frequencies. FIG. 4, is a phasor diagram 72 illustrating a current phasor 74 and voltage phasor 75 associated with a selected frequency $f_i$ of the sensed differential currents and voltages now represented in the frequency domain. The current phasor 74 and voltage phasor are illustrated graphically with respect to a voltage axis 76 and current axis 78. Furthermore, as shown, the current phasor 74 may be resolved into the resistive component 84 (e.g., in phase with the voltage) due to the equivalent resistance 70 and the capacitive component 86 due to the equivalent capacitance 68 as shown in FIG. 4. An angle θ, indicated by reference numeral 80, is the phase angle between the total differential current 74 and the voltage 84. The complement of the angle θ, indicated by the angle δ and reference numeral 82 in FIG. 4 provides an indication of insulation condition, as discussed below. For each winding e.g., 36, 38 monitored, then, the current phasor 74 consists of a resistive current component 84 and a capacitive current component 86.

A dissipation factor may be defined as the measure of the degree of electrical loss due to imperfect nature of the insulation condition of an electrical system. The dissipation factor, which may be computed as the tangent of the angle δ, is determined from the ratio of the resistive current component 84 to the capacitive current component 86. Degradation, damage, or contamination of the insulation results in changes of the desired parameters, culminating in an increase in angle δ, and a decrease in angle θ, resulting from an increase in differential current and an increase in resistive current loss. Unlike known systems, however, the present techniques permit monitoring of such parameters and conditions during operation of the machine, that is, without requiring that the machine be shutdown.

FIG. 5 is a flow chart illustrating exemplary steps involved in insulation condition monitoring via a system of the type shown in FIG. 1. The general analytical process, designated by the reference numeral 88, begins with measurement of values for the instantaneous differential current and the instantaneous phase voltage during operation of the machine, as indicated at reference numeral 90. These parameters are measured via the differential current sensors and the voltage sensors, respectively. At step 92, the output from the current sensors and the voltage sensors is filtered and digitized as discussed above. At step 94, the values for instantaneous differential current and instantaneous differential voltage are converted to respective values for phasor current and phasor voltage corresponding to selected frequencies via a processing module. At step 96, an angular relationship between the phasor current and phasor voltage at the selected frequencies is calculated and at step 98 an output is generated based on the angular relationship as an indication of insulation condition via the processing module. As discussed above, in a present embodiment, the tangent of the angle δ provides an indication of the insulation system condition. The output generated from the processing module, is stored in a memory module. At step 100, the output of the processing module is compared to a predetermined threshold value and an alert is generated when the output of the processing module exceeds the threshold value, via the indicator module. The value used for the comparison will generally depend upon empirical conditions, and may be determined on a winding, winding group or machine basis for each application. Moreover, as noted above, the indications may be analyzed, such as by trending, to determine and anticipate needs for servicing the machine and windings. As also above, where monitoring is provided for individual windings or winding groups, the analysis may include localization of degradation of the insulation system of one or more particular windings or winding groups.

One advantage of the present technique is that the insulation condition monitoring system does not require specialized equipment and does not depend for interpretation on the skill of an operator. The monitoring system could be based on utilizing current and voltage sensors, thereby enabling easy retrofitting to existing machines. Another advantage of the monitoring system is that the system could be used "online," while the machine is under operation. Yet another advantage of the exemplary embodiments disclosed herein is that it takes advantage of the multi-frequency content of the excitation ripple to ascertain additional information regarding the status of the insulation of the electric machine. For example, certain characteristics may be more evident at a selected harmonics as opposed to the fundamental frequency. Therefore, the exemplary embodiments may provide more accurate evaluation of insulation condition and prediction of breakdown. Other benefits of the present insulation monitoring techniques includes non-invasive measurement, using trending to detect incipient winding failures for condition based maintenance, application to all single phase or three phase electric machines including motors, generators, and power transformers for insulation condition monitoring.

The disclosed method may be embodied in the form of computer-implemented processes and apparatuses for practicing those processes. The method can also be embodied in the form of computer program code containing instructions embodied in tangible media 22, such as floppy diskettes, CD-ROMs, hard drives, or any other computer-readable storage medium, wherein, when the computer program code is loaded into and executed by a computer, the computer becomes an apparatus capable of executing the method. The present method can also be embodied in the form of computer program code, for example, whether stored in a storage medium, loaded into and/or executed by a computer, or as data signal 23 transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

It will be appreciated that the use of first and second or other similar nomenclature for denoting similar items is not intended to specify or imply any particular order unless otherwise stated. Furthermore, the use of the terminology "a" and "at least one of" shall each be associated with the meaning "one or more" unless specifically stated otherwise.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An insulation condition monitoring method, comprising:
    measuring a first set of values for an instantaneous differential current and an instantaneous voltage during operation of a rotating DC electric machine;
    calculating a value for a phasor current and phasor voltage based upon the first set of values of said instantaneous differential current and said instantaneous voltage, respectively;
    digitalizing said instantaneous differential current and said instantaneous voltage at a selected frequency for evaluating a desired parameter of insulation condition;
    calculating an angular relationship between said phasor current and said phasor voltage; and
    determining said desired parameter of said insulation condition based on said angular relationship.

2. The method of claim 1, further comprising determining said desired parameter from said angular relationship between said phasor current and said phasor voltage.

3. The method of claim 2, wherein the desired parameter includes at least one of: a phase angle between said phasor current and said phasor voltage; an AC insulation resistance value; and a dissipation factor.

4. The method of claim 1, wherein said measuring corresponds to a selected winding of the electric machine.

5. The method of claim 4, wherein said selected winding corresponds to at least one of an armature and a field winding.

6. The method of claim 1 further including calculating a value for another phasor current and another phasor voltage based upon said first set of values of said instantaneous differential current and said instantaneous voltage, respectively.

7. A method of operating an insulation condition monitoring system, the method comprising:
    measuring a first set of values for an instantaneous differential current and an instantaneous voltage during operation of a rotating DC electric machine;
    calculating a value for a phasor current and a phasor voltage based upon said first set of values of said instantaneous differential current and said instantaneous phase voltage, respectively;
    digitalizing said instantaneous differential current and said instantaneous voltage at a selected frequency for evaluating a desired parameter;
    calculating an angular relationship between said phasor current and said phasor voltage; and
    calculating said desired parameter based on said angular relationship between said phasor current and said phasor voltage for determining insulation condition.

8. The method of claim 7, wherein said values for said instantaneous differential current and said instantaneous voltage are measured via a differential current sensor and a voltage sensor respectively.

9. The method of claim 8, further comprising filtering an output from said current sensor and an output from said voltage sensor.

10. The method of claim 7, wherein said desired parameter includes at least one of: a phase angle between said phasor current and said phasor voltage; an AC insulation resistance value; and a dissipation factor.

11. The method of claim 7, wherein said measuring corresponds to a selected winding of the electric machine.

12. The method of claim 11, wherein said selected winding corresponds to at least one of an armature and a field winding.

13. The method of claim 7 further including calculating a value for another phasor current and another phasor voltage based upon said first set of values of said instantaneous differential current and said instantaneous voltage, respectively.

14. An insulation condition monitoring system, comprising:
    a differential current sensor coupled to a rotating DC electric machine for measuring values of current;
    a voltage sensor coupled to said rotating DC electric machine for measuring values of AC voltage;
    a processing module coupled to said current sensor and said voltage sensor, said processing module configured to convert values for instantaneous differential current and instantaneous voltage to respective values for phasor current and phasor voltage, and wherein said processing module is further configured to calculate an angular relationship between said phasor current and said phasor voltage and generating an output based on said angular relationship as an indication of insulation condition; and a data acquisition system for digitalizing said instantaneous differential current and said instantaneous voltage at a selected frequency for evaluating a desired parameter of said insulation condition.

15. The system of claim 14, wherein said data acquisition system further filters an output from said differential current sensor and an output from said voltage sensor.

16. The system of claim 14, further comprising a memory module for storing an output generated from said processing module.

17. The system of claim 14, further comprising an indicator module coupled to said processing module, said indicator module configured to indicate said insulation condition based on an output from said processing module.

18. The system of claim 17, wherein said indicator module compares an output of said processing module to a selected threshold value and generates an alert when said output exceed said threshold value.

19. A rotating electric machine, comprising:
an armature and a field winding configured to conduct electric current and generate magnetic field by virtue of flow of said current;
a plurality of conductors to conduct electric current to said windings;
an insulation system for insulating said windings;
an insulation condition monitoring system including:
a differential current sensor coupled to the rotating electric machine for measuring values of instantaneous differential current of at least one of said armature and said field winding;
a voltage sensor coupled to the rotating electric machine for measuring values of instantaneous voltage of said at least one of said armature and said field winding;
a processing module coupled to said current sensor and said voltage sensor, said processing module configured to convert values for instantaneous differential current and instantaneous voltage to respective values for phasor current and phasor voltage, and wherein said processing module is further configured to calculate an angular relationship between said phasor current and said phasor voltage and generating an output based on said angular relationship as an indication of insulation condition; and
a data acquisition system for digitalizing said instantaneous differential current and said instantaneous voltage at a selected frequency for evaluating a desired parameter of said insulation condition.

20. The machine of claim 19, wherein said data acquisition system further filters an output from said differential current sensor and said voltage sensor.

21. The machine of claim 19, further comprising a memory module for storing an output generated from said processing module.

22. The machine of claim 21, further comprising an indicator module coupled to said processing module, said indicator module configured for indicating said insulation condition based on an output from said processing module.

23. The machine of claim 22, wherein said indicator module compares an output of said processing module to a selected threshold value and generates an alert when said output axceeds said threshold value.

24. The machine of claim 19, wherein the electric machine comprises a DC rotating electric machine.

25. An insulation condition monitoring system, comprising:
a means for measuring a first set of values for an instantaneous differential current and an instantaneous differential voltage during operation of a rotating DC electric machine;
a means for calculating a value for a phasor current and a value for a phasor voltage based upon said first set of values of said instantaneous differential current and said instantaneous phase voltage, respectively;
a means for digitalizing said instantaneous differential current and said instantaneous voltage at a selected frequency for evaluating a desired parameter of insulation condition;
a means for calculating an angular relationship between said phasor current and said phasor voltage; and
a means for determining said desired parameter of said insulation condition based on said angular relationship.

26. A storage medium encoded with a machine-readable computer program code for a method of monitoring an insulation condition including instructions for causing a computer to implement the method comprising:
measuring a first set of values for an instantaneous differential current and an instantaneous voltage during operation of a rotating DC electric machine;
calculating a value for a phasor current and phasor voltage based upon said first set of values of said instantaneous differential current and said instantaneous voltage, respectively;
digitalizing said instantaneous differential current and said instantaneous voltage at a selected frequency for evaluating a desired parameter of insulation condition;
calculating an angular relationship between said phasor current and said phasor voltage; and
determining said desired parameter of said insulation condition based on said angular relationship.

27. A computer data signal embodied in a computer readable format for monitoring an insulation condition, said computer data signal including instructions for causing a computer to implement a method comprising:
measuring a first set of values for an instantaneous differential current and an instantaneous voltage during operation of a rotating DC electric machine;
calculating a value for a phasor current and phasor voltage based upon said first set of values of said instantaneous differential current and said instantaneous voltage, respectively;
digitalizing said instantaneous differential current and said instantaneous voltage at a selected frequency for evaluating a desired parameter of insulation condition;
calculating an angular relationship between said phasor current and said phasor voltage; and
determining said desired parameter of said insulation condition based on said angular relationship.

* * * * *